United States Patent
Joshi et al.

(10) Patent No.: US 10,820,454 B2
(45) Date of Patent: Oct. 27, 2020

(54) VAPOR CHAMBER HEAT SPREADERS WITH ENGINEERED VAPOR AND LIQUID FLOW PATHS

(71) Applicant: Toyota Motor Engineering & Manufacturing North America, Inc., Erlanger, KY (US)

(72) Inventors: Shailesh N. Joshi, Ann Arbor, MI (US); Feng Zhou, South Lyon, MI (US)

(73) Assignee: Toyota Motor Engineering & Manufacturing North America, Inc., Plano, TX (US)

( * ) Notice: Subject to any disclaimer, the term of this patent is extended or adjusted under 35 U.S.C. 154(b) by 0 days.

(21) Appl. No.: 15/885,368

(22) Filed: Jan. 31, 2018

(65) Prior Publication Data
US 2019/0239395 A1 Aug. 1, 2019

(51) Int. Cl.
  *H05K 7/20* (2006.01)
  *F28D 15/04* (2006.01)
  *H01L 23/427* (2006.01)

(52) U.S. Cl.
  CPC ......... *H05K 7/20936* (2013.01); *F28D 15/04* (2013.01); *H01L 23/427* (2013.01); *H05K 7/20336* (2013.01)

(58) Field of Classification Search
  CPC .... F28D 15/04; F28D 15/046; F28D 15/0233; H05K 7/20936; H01L 23/427
  See application file for complete search history.

(56) References Cited

U.S. PATENT DOCUMENTS

| 6,550,531 B1 * | 4/2003 | Searls ................ F28D 15/0233 165/104.26 |
| 8,720,530 B2 | 5/2014 | Fatemeh et al. |
| 9,455,177 B1 | 9/2016 | Park et al. |

(Continued)

FOREIGN PATENT DOCUMENTS

| CN | 204006814 U | 12/2014 |
| WO | WO2017100568 A2 | 6/2017 |

OTHER PUBLICATIONS

Mohammad Reza Shaeri, Daniel Attinger, Richard W. Bonner III, "Vapor Chambers with Hydrophobic and Biphilic Evaporators in Moderate to High Heat Flux Application," Applied Thermal Engineering, Feb. 5, 2018, pp. 83-92, Elsevier B.V., The Netherlands.

*Primary Examiner* — Travis C Ruby
*Assistant Examiner* — Harry E Arant
(74) *Attorney, Agent, or Firm* — Dinsmore & Shohl LLP

(57) ABSTRACT

A vapor chamber heat spreader includes a condenser arranged at a top end of the vapor chamber heat spreader, an evaporator arranged at an opposite end to the condenser; and multi-level wick structures. The multi-level structures include a first planar wick arranged adjacent to the condenser, a second planar wick arranged adjacent to the evaporator, a plurality of condenser posts for supplying liquid condensed by the condenser, a plurality of evaporator posts for supply the liquid towards the evaporator, and a mesh layer. The mesh layer is arranged between the condenser posts and the evaporator posts and configured to separate the condenser posts from the evaporator posts. The mesh layer includes a plurality of vent holes. The mesh layer is a porous layer having high permeability.

17 Claims, 5 Drawing Sheets

(56) References Cited

U.S. PATENT DOCUMENTS

| | | | |
|---|---|---|---|
| 2007/0056714 A1* | 3/2007 | Wong | F28D 15/0233 |
| | | | 165/104.26 |
| 2009/0288808 A1* | 11/2009 | Chin | F28D 15/025 |
| | | | 165/104.33 |
| 2010/0300656 A1 | 12/2010 | Lu et al. | |
| 2010/0307003 A1 | 12/2010 | Hoffman et al. | |
| 2011/0168359 A1* | 7/2011 | Lin | F28D 15/0233 |
| | | | 165/104.26 |
| 2011/0240264 A1 | 10/2011 | Wang et al. | |
| 2016/0076820 A1* | 3/2016 | Lewis | F28D 15/0233 |
| | | | 165/104.26 |

* cited by examiner

VAPOR CHAMBER HEAT SPREADERS WITH ENGINEERED VAPOR AND LIQUID FLOW PATHS

BACKGROUND

Field

The present specification generally relates to high performance vapor chamber heat spreaders with engineered vapor and liquid flow paths for cooling heat generating devices. More specifically, the present specification is directed to multi-level wick structures for a vapor chamber heat spreader which implement and facilitate engineered vapor and liquid flow paths.

Technical Background

Vapor chamber heat spreading technology has been employed to uniformly spread heat on the surface of a heat sink. A vapor chamber heat spreader may be coupled to a heat-generating device, such as a power electronics device, to remove heat and lower the maximum operating temperature of the heat-generating device. In order to spread the heat, two-phase or boiling phenomena are used to provide an isothermal surface.

FIG. 7 illustrates a schematic view of a conventional vapor chamber heat spreader 300 (hereinafter referred to as "vapor chamber"). As shown in FIG. 7, the vapor chamber includes an evaporator at the base end and a condenser at the top end which are arranged at opposite ends. A heat source, i.e., a heat generating device (not shown), generates heat which is supplied to an evaporator side.

In principle, the heat from a heat generating device at hotspots boils a coolant inside the vapor chamber 300. As a result, vapor is generated and rises towards a condenser side, extracting heat from an evaporator side, as shown in FIG. 7. The condenser condenses the vapor over an adjacent porous surface into a liquid state. In the vapor chamber 300, condensed liquid is then carried back to the evaporator by means of a porous wick structure 310 attached to the inside walls of the vapor chamber 300 with capillary action.

As shown in FIG. 7, condensed liquid is transferred back laterally along the inner walls to reach the evaporator. Such a lateral liquid flow path may present dry out problems in case of high heat fluxes. For example, the lateral liquid flow path may not efficiently dissipate high heat fluxes because there is not sufficient time for the condensed liquid to travel back to the evaporator to cool down high heat fluxes and as a result, only vapor is formed at or near the evaporator side. Then dry out problems may occur, which can potentially cause a heating generating device to get damaged from thermal run away.

SUMMARY

In one embodiment, a vapor chamber heat spreader includes a condenser arranged at a top end, an evaporator arranged at an opposite end to the condenser; and multi-level wick structures. The multi-level structures include a first planar wick arranged adjacent to the condenser, a second planar wick arranged adjacent to the evaporator, a plurality of condenser posts for supplying condensed liquid by the condenser, and a plurality of evaporator posts for supplying the condensed liquid towards the evaporator, and a mesh layer. The mesh layer is arranged between the condenser posts and the evaporator posts and configured to separate the condenser posts from the evaporator posts. The mesh layer includes a plurality of vent holes. The mesh layer is a porous layer having high permeability. The condenser posts extend from the first planar wick to the mesh layer and the evaporator posts extend from the mesh layer to the evaporator.

In another embodiment, multi-level wick structures for a vapor chamber heat spreader may include multiple liquid flow paths. The multiple liquid flow paths include a vertical liquid flow path and a lateral liquid flow path. The vertical liquid flow path provides a shorter liquid flow path and facilitates faster and enhanced liquid supply in a hot spot area. As the multi-level wick structures quickly replenish condensed liquid using the shorter liquid path and faster supply of the condensed liquid, situations where only vapor is present at or near an evaporator side may be avoided. Thus, dry out problems at high heat fluxes may be alleviated and thermal runaway resulting from the dry out problems may be avoided.

In yet another embodiment, the multi-level wick structures may include posts which serve as a liquid supply channel. The posts include condenser posts arranged adjacent to a condenser side and evaporator posts arranged adjacent to an evaporator side. The condenser posts and the evaporator posts may or may not be aligned with respect to each other. Alternatively, or additionally, each of the condenser posts and the evaporator posts forms a continuous post for supplying condensed liquid, extending from the condenser side to the evaporator side. Alternatively, or additionally, a mesh layer may or may not be arranged to separate the condenser posts from the evaporator posts.

In yet another embodiment, a vapor chamber heat spreader includes a condenser arranged at a top end, an evaporator arranged at an opposite end to the condenser, and multi-level wick structures comprising a first liquid flow channel, a second liquid flow channel, and a vapor flow channel. The first liquid flow channel includes a lateral movement of condensed liquid from the condenser to the evaporator, and the second liquid flow channel includes a downward movement of the condensed liquid from the condenser to the evaporator. The vapor flow channel includes an upward movement of vapor from the evaporator to the condenser and the vapor flow path does not overlap with the second liquid flow path in a hot spot area where a heat source is present.

In yet another embodiment, a method for supplying liquid in a vapor chamber heat spreader having a condenser and an evaporator includes the steps of arranging a plurality of condenser posts adjacent to the condenser in a predetermined hot spot area and arranging a plurality of evaporator posts adjacent to the evaporator in the predetermined hot spot area. The method further includes steps of arranging a planar wick structure along an inner wall of the vapor chamber heat spreader to extend in a lateral direction perpendicular to the vertical direction, outside of the predetermined hot spot area, supplying condensed liquid from the condenser to the evaporator via the condenser posts and the evaporator posts in the vertical direction, and supplying the condensed liquid from the condenser to the evaporator via the planar wick structure in the lateral direction.

The foregoing and other aspects, features, details, utilities, and advantages of the present invention will be apparent from reading the following description and claims, and from reviewing the accompanying drawings.

DETAILED DESCRIPTION

The present disclosure relates generally to vapor chamber heat spreaders with engineered vapor and liquid flow paths for providing enhanced supply of liquid. The vapor chamber heat spreader (hereinafter referred to as the "vapor chamber") includes multi-level wick structures that facilitate enhanced and timely supply of condensed liquid to an evaporator side. Accordingly, the condensed liquid may be supplied timely and efficiently and dry out problems resulting from vapor only being present at or near the evaporator side due to high heat fluxes may be reduced or avoided. Moreover, thermal runaway resulting from the dry out problems may be reduced or avoided. The multi-level wick structures described herein include two sets of posts for supplying the condensed liquid and a mesh layer separating the two sets of posts from each other. In the present disclosure, the posts and the mesh layer are structured and arranged to form engineered liquid flow paths within the vapor chamber. As posts and the mesh layer define the liquid flow paths, they further define and engineer a vapor flow path.

As used herein, the term "wick structure" refers to any porous structure that is used to supply condensed liquid within a vapor chamber with capillary action. The wick structure varies in size, shape and materials used therein. In one embodiment, the wick structure may have planar shape with varying thickness. A planar wick structure may include a porous layer. In another embodiment, the wick structure may include post or pin shape for supplying the condensed liquid. The wick structure may be made from large particles or small particles.

As used herein, the term "multi-level wick structures" refers to two or more wick structures having different porosity and permeability. In one embodiment, the multi-level wick structures include a wick structure having 30%-50% porosity and another wick structure having 60-80% porosity. In another embodiment, the multi-level wick structure includes a wick structure having high porosity and another wick structure having low permeability. In yet another embodiment, the multi-level wick structure includes a wick structure having high permeability in an exemplary range from the mesh layer includes a porous layer having high permeability of a range between $1 \times e^{-13}$ to $4 \times e^{-14}$. The multi-level wick structures may include one or more planar wicks. In another embodiment, the multi-level wick structures include posts or pins for drawing the condensed liquid with capillary action and supplying the condensed liquid. In further other embodiments, the multi-level wick structures include a porous mesh layer that separates posts or pins. Alternatively, the multi-level wick structures may include continuous porous posts or pins connecting a condenser side and an evaporator side. The multi-level wick structures may extend and be arranged between the condenser side and the evaporator side of the vapor chamber.

Figure 1:
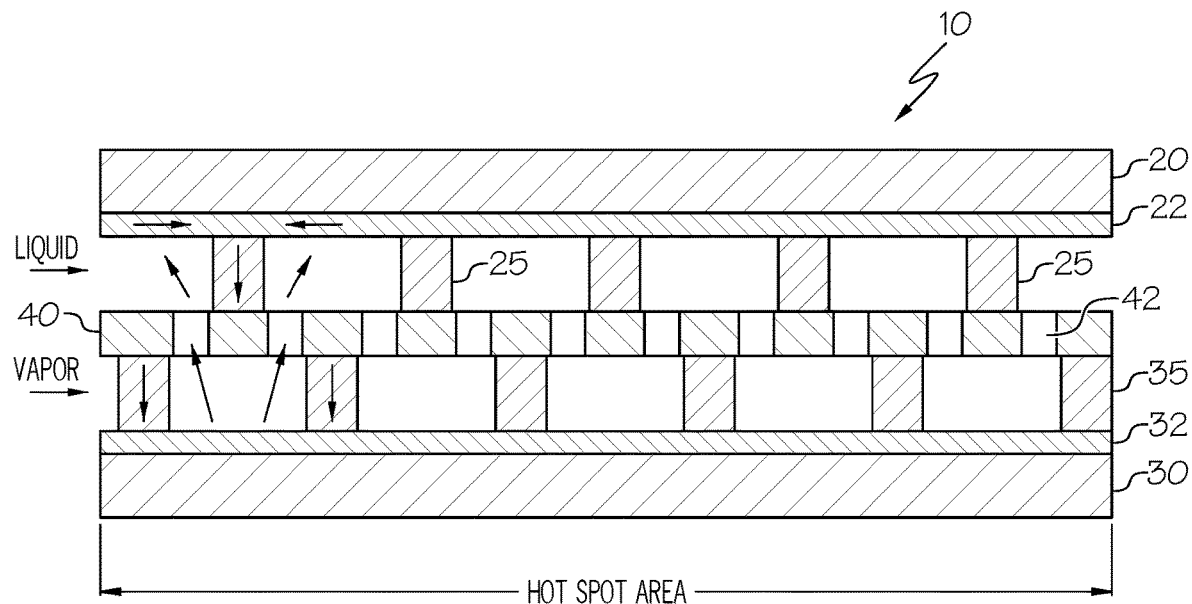
FIG. 1 illustrates a cross sectional view of an example vapor chamber heat spreader according to one or more embodiments described and illustrated herein.
Figure 2:
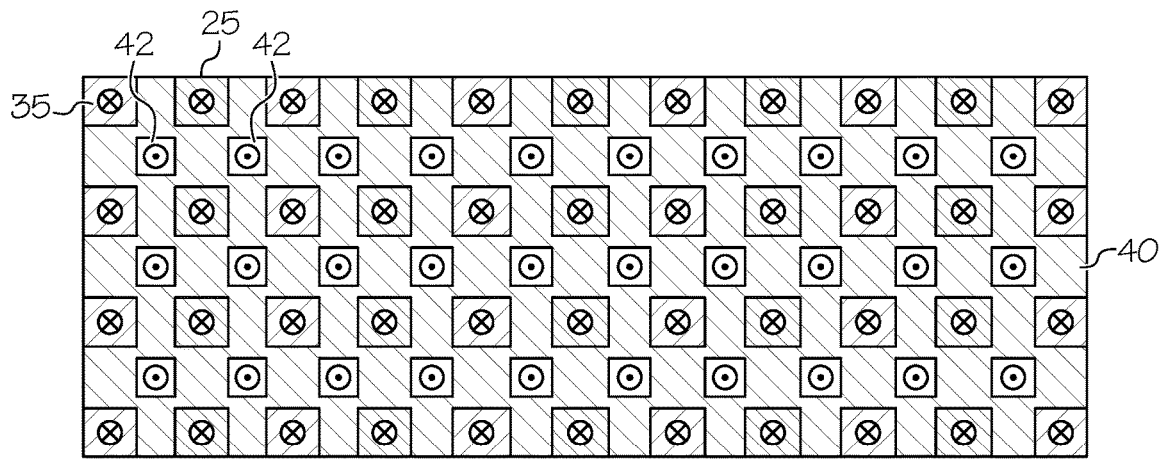
FIG. 2 illustrates a top view of the vapor chamber heat spreader of FIG. 1.
Figure 3:
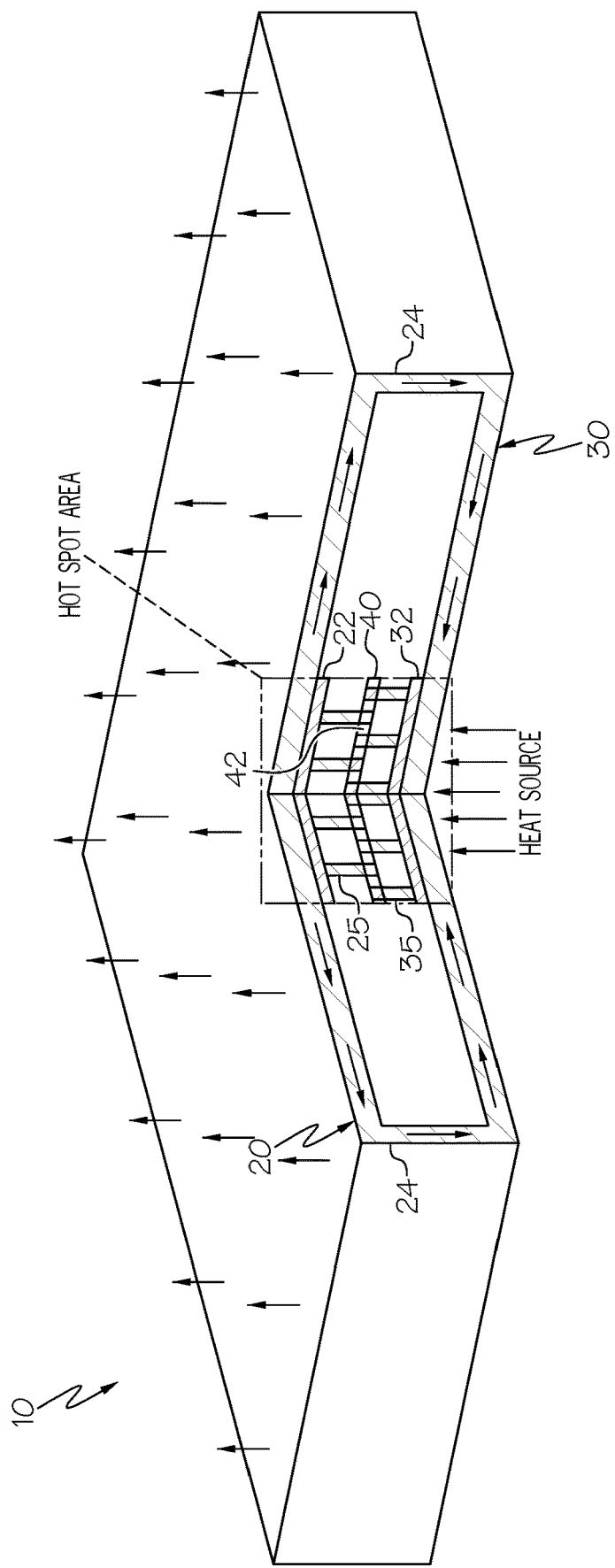
FIG. 3 illustrates a perspective view of the vapor chamber heat spreader of FIG. 1.

Referring now to the drawings, FIGS. 1-3 depict various views of illustrative multi-level wick structures for an example vapor chamber 10, according to one or more embodiments of the present disclosure. As shown in FIG. 1, the example vapor chamber 10 includes a condenser 20 and an evaporator 30 arranged to be an opposite side to the condenser 20. A planar wick 22 is arranged adjacent to the condenser 20 and another planar wick 32 is arranged adjacent to the evaporator 30. The planar wick 22 and the planar wick 32 serve to hold condensed liquid. In this embodiment, the planar wick 32 may be thin to initiate boiling faster. Preferably, the planar wick 22 may be formed as a thin layer to reduce thermal resistance. Alternatively, or additionally, the planar wick 22 may be thinner and formed with relatively smaller particles in order to generate high capillary pressure.

Posts 25 are arranged adjacent to the condenser 20 and referred to as condenser posts 25. Posts 35 are arranged adjacent to the evaporator 30 and referred to as evaporator posts 35. The condenser posts 25 and the evaporator posts 35 are porous structures. In some embodiments, the condenser posts 25 and the evaporator posts 35 may be separated by a mesh layer 40 as shown in FIG. 1. The mesh layer 40 may include a porous layer having high permeability. By way of example, the mesh layer may high permeability of an exemplary range between $1 \times e^{-13}$ to $4 \times e^{-14}$. However, the embodiments of the present disclosure are not limited to the exemplary range and other ranges are possible. High permeability property of the mesh layer 40 may result in lower pressure drop in the mesh layer 40. The mesh layer 40 includes a plurality of vent holes 42 which permits easy egress of the vapor from the evaporator 30 to the condenser side. The mesh layer 40 also may experience moderate to low capillary pressure for movement of the condensed liquid due to a shorter liquid flow path from the condenser 20 to the evaporator 30. The mesh layer 40 serves as a manifold to distribute the condensed liquid to the evaporator posts 35, as will be further described in detail below in connection with operations of the vapor chamber.

In some embodiments, the mesh layer 40 may include a sintered porous layer having high permeability. In other embodiments, the mesh layer 40 may include a porous copper inverse opal (CIO) structure having high permeability as CIO wick structures provide the advantage of improved control over pore sizes and distribution. The mesh layer 40 may not be limited to wick structures described here and other suitable porous layers, films, or wick structures are possible.

In some embodiments, exemplary dimensions of the multi-level wick structures are as follows. The dimensions below are by way of example only and the present disclosure is not limited thereto. The thickness of the planar wicks 22 and the planar wick 32 may be 0.3 mm. The dimensions of each of the condenser posts 25 and each of the evaporator posts 35 may be identical, for example, 1 mm×1 mm×0.25 mm. In other embodiments, the dimensions of the condenser posts 25 and the evaporator posts 35 may be different. The thickness of the mesh layer 40 may be about 0.1 mm. The size of a vent hole 42 may be 1.5 mm×1.5 mm.

The condenser posts 25 and the evaporator posts 35 are arranged in an alternating pattern throughout a hot spot area of the vapor chamber 10, as shown in FIGS. 1-3. In other words, the condenser posts 25 and the evaporator posts 35 are not aligned in a vertical direction extending from the condenser 20 to the evaporator 30. In a horizontal or lateral direction extending in parallel to the condenser 20 and the evaporator 30, the evaporating posts 35 are spaced apart from each other and vent holes 42 are arranged between two neighboring evaporator posts 35 as shown in FIGS. 1-3. The condenser posts 25 are arranged side by side in the lateral direction and do not to overlap with the vent holes 42 present in the mesh layer 40, as shown in FIGS. 1-3.

The condenser posts 25 and the evaporator posts 35 are separated via the mesh layer 40 in the vertical direction. A vapor flow path is engineered via the vent holes 42 arranged in the mesh layer 40. The vapor flow path is further engineered by using each space between two neighboring evaporator posts 35 and each space between two neighboring condenser posts 25. As indicated with upward arrows in FIG. 1, the vapor rises towards the condenser 20 via the vent holes 42. The vapor is captured by the planar wick 22 adjacent to the condenser 20 and is condensed by the condenser 20. As a result, condensed liquid transfers back to the evaporator 30 via the condenser posts 25, the mesh layer 40 and the evaporator posts 35, as shown with downward arrows of FIG. 1. Thus, a liquid flow path engineered and formed by the condenser posts 25, the mesh layer 40 and the evaporator posts 35 does not overlap with the vapor flow path.

Figure 4:
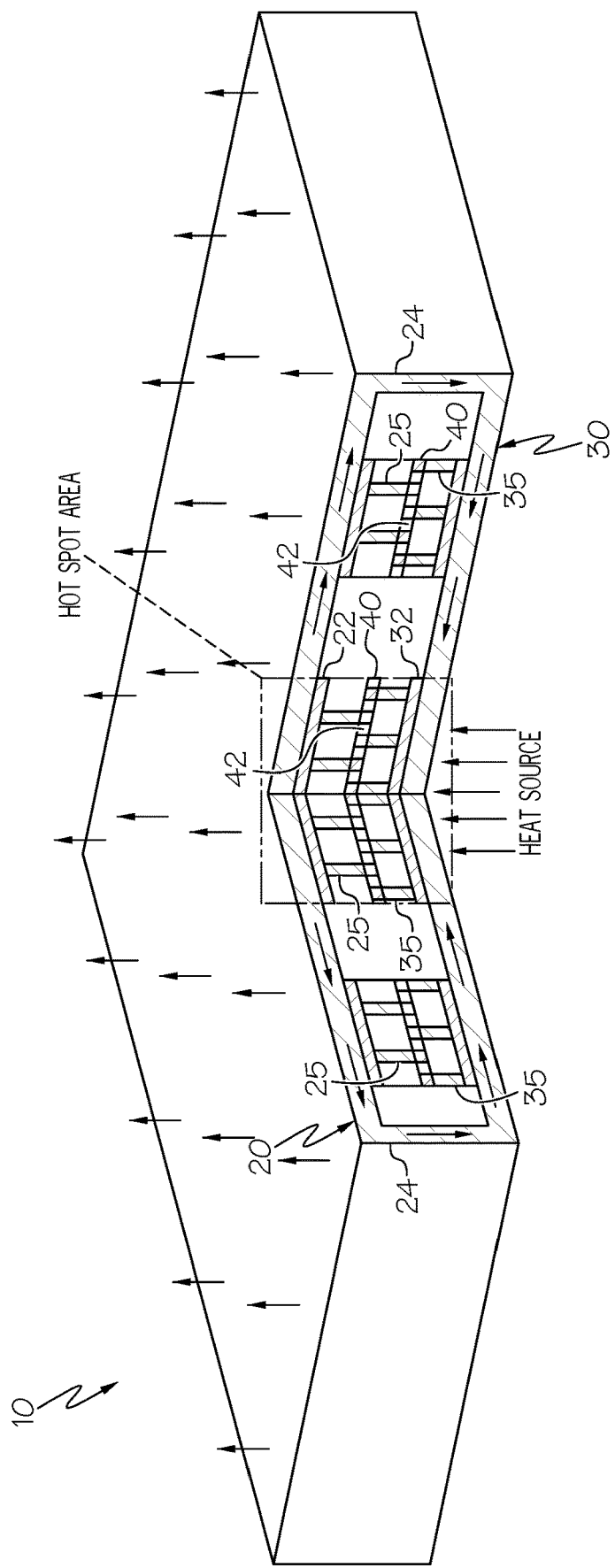
FIG. 4 illustrates a perspective view of another example vapor chamber heat spreader according to one or more embodiments described and illustrated herein.

FIG. 3 illustrates a perspective view of the vapor chamber 10 according to one embodiment of the present disclosure. In a non-limiting example, the vapor chamber 10 has dimensions of about 100 mm×100 mm×4 mm and the hot spot area has dimensions of about 10 mm×10 mm×1 mm. However, the present disclosure is not limited to these dimensions and other dimensions are possible. As shown in FIG. 3, the condenser posts 25 and the evaporator posts 35 along with the mesh layer 40 are arranged in a hot spot area where a heat source is located. The present disclosure is not limited to this embodiment. In other embodiments, the multi-level wick structures having the posts 25 and 35 may not be limited to the hot spot area and extend outside of the hot spot area, as shown in FIG. 4.

Referring to FIGS. 1-3, operations of the vapor chamber 10 are described in detail. In operation, a heat generating device generates heat as a heat source to the vapor chamber 10. The heat supplied to the vapor chamber boils a coolant in the evaporator 30 and as a result, vapor is generated. The vapor rises through a space between two neighboring evaporator posts 35, the vent holes 42 present in the mesh layer 40 and then, a space between two neighboring condenser posts 35, towards the side of the condenser 20. Fins or a cooling mechanism on the condenser 20 condenses the vapor into the liquid state. The condensed liquid then flows toward the evaporator 30 to sustain boiling from the heat.

As shown in FIGS. 1-3, the condensed liquid travels downward towards the evaporator 30 via the condenser posts 25, the mesh layer 40 and the evaporator posts 35. As shown with the downward arrows in FIG. 1, the condensed liquid moves downward via the condenser posts 25 by capillary action. Then the condensed liquid reaches the mesh layer 40 which serves as a manifold to distribute the condensed liquid to the evaporator posts 35. The condensed liquid moves further downward to reach the evaporator 30 by capillary action.

The condenser posts 25 and the evaporator posts 35 are arranged in the hot spot area where a heat generating device is present. The heat source is concentrated in the hot spot area. Outside of the hot spot area, the condenser posts 25 and the evaporator posts 35 may not be arranged, as shown in FIG. 3. Instead, in those areas, the condensed liquid is supplied to the evaporator 30 laterally from the side of the vapor chamber 10, as will be further described below.

Alternatively, or additionally, one or more hot spot areas may be present throughout the entire length of the vapor chamber 10, as shown in FIG. 4. Then the condenser posts 25, the evaporator posts 35 and the mesh layer 40 separating these posts 25, 35 can be arranged to provide enhanced liquid supply, as shown in FIG. 4.

Referring back to FIGS. 1-2, the vapor generated from boiling at the side of the evaporator 30 makes the upward movement towards the condenser 20. As shown by the upward arrows in FIG. 1, the vapor rises through the space between the two neighboring evaporator posts 35 and passes through the vent holes 42 present in the mesh layer 40. Then, the vapor further rises through the space between the two neighboring condenser posts 25. Thus, a vapor supply channel is formed by the evaporator posts 35, the vent holes 42 and the condenser posts 25, which defines the vapor flow path, as shown in FIGS. 1-2. Likewise, the condenser posts 25, the mesh layer 40 and the evaporator posts 35 form a liquid supply channel, which also defines a condensed liquid flow path. As shown with lateral arrows in FIG. 3, another condensed liquid supply channel is formed, defining the lateral supply of the condensed liquid from the side of the vapor chamber 10.

As shown in FIG. 1, the vapor flow path and the condensed liquid flow path in the hot spot area may not overlap. Also, the condensed liquid flow path via the condenser posts 25 and the condensed liquid flow path via the evaporator posts 35 are separated by the mesh layer 40. With respect to the condensed liquid supply and the vapor supply, the vapor rise through the vent holes 42 towards the condenser 20, and further serves as a manifold to distribute the liquid to the evaporator posts 35, as discussed above and shown in FIGS. 1-3.

FIG. 3 depicts both the vertical and lateral flow paths of the condensed liquid within the vapor chamber 10 according to the present disclosure. A first liquid flow path from the condenser 20 to the evaporator 30 includes a lateral path along the wick structure of the vapor chamber 10. In FIG. 4, the lateral path is illustrated as a path extending toward the far side 24 of the vapor chamber 10. A second liquid flow path from the condenser 20 to the evaporator 30 includes a much shorter and more direct path via the condenser posts 25, the mesh layer 40 and the evaporator posts 35. Due to the shorter and direct path, the dry out problems and thermal run away damages may be alleviated or avoided. As shown in FIG. 3, the shorter path may be arranged in the hot spot area and the lateral, longer path may be arranged outside of the hot spot area. Alternatively, the shorter path may be arranged throughout the vapor chamber based on presence of multiple hot spot areas, as shown in FIG. 4.

Alignment and arrangements of the condenser posts 25 and the evaporator posts 35 are not limited to the embodiment as shown in FIGS. 1-3. The alignment and arrangements of the posts 25, 35 may vary and can be changed based on structural and design needs of vapor and liquid flow channels accommodating vapor and liquid flow paths. The formation and placement of the mesh layer 40 may be subject to change based on the same or similar structural and design needs.

Figure 5:
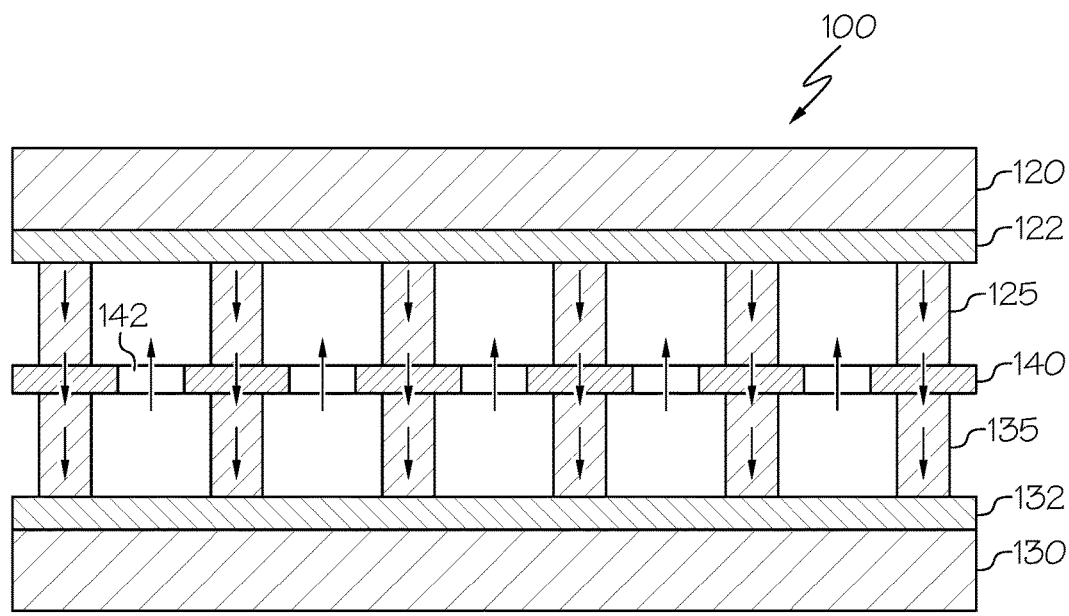
FIG. 5 illustrates a cross sectional view of an example vapor chamber heat spreader according to one or more embodiments described and illustrated herein.

FIG. 5 depicts multi-level wick structures for another example vapor chamber heat spreader 100 according to one or more embodiments of the present disclosure. The multi-level wick structures include a condenser side planar wick 122, condenser posts 125, a mesh layer 140, evaporator posts 135 and an evaporator planar wick 132. The structural aspects of the multi-level wick structures of FIG. 5 may be similar to those described above in connection with FIGS. 1-3 and the explanations with respect to the condenser side planar wick 122, the condenser posts 125, the mesh layer 140, the evaporator posts 135 and the evaporator planar wick 132 are not repeated here. In the illustrated embodiment, the condenser posts 125 and the evaporator posts 135 are aligned with each other in a vertical direction extending between the condenser 120 and the evaporator 130.

As the condenser posts 125 and the evaporator posts 135 are aligned, condensed liquid is supplied to the evaporator 130 via the condenser posts 125, the evaporator posts 135 and the mesh layer 140. Vent holes 142 are arranged in the mesh layer 140 such that the vapor rises towards the condenser 120 without overlapping with the condensed liquid flow path. As the condenser posts 125 and the evaporator posts 135 are aligned in this embodiment, configuration and arrangements of the multi-level wick structures may be simple and cost-effective.

Figure 6:
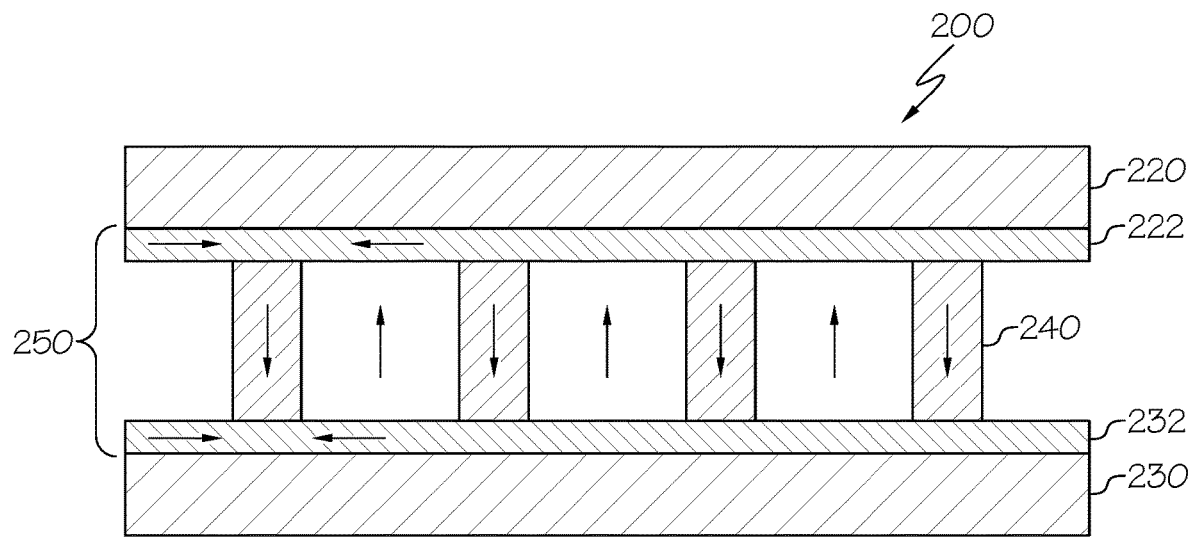
FIG. 6 illustrates a cross sectional view of an example vapor chamber heat spreader according to one or more embodiments described and illustrated herein.
Figure 7:
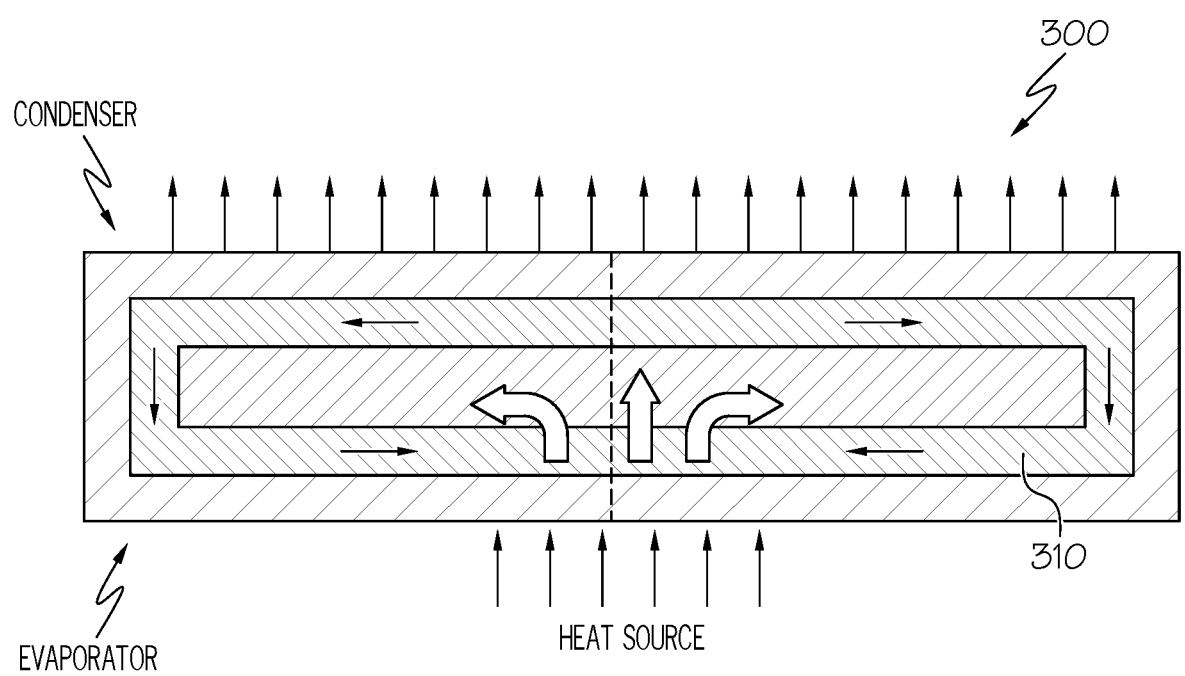
FIG. 7 illustrates a schematic view of a related art vapor chamber heat spreader.

FIG. 6 illustrates multi-level wick structures for another example vapor chamber heat spreader 200 according to one or more embodiments of the present disclosure. The vapor chamber 200 includes a condenser 220, an evaporator 230 and multi-level wick structures 250. The multi-level wick structures 250 include a condenser side planar wick 222, posts 240, and an evaporator planar wick 232. The structural aspects of the multi-level wick structures 250 of FIG. 6 may be similar to those described above in connection with FIGS. 1-3 and 5. Instead of arranging the condenser posts 25, 125 and the evaporator posts 35, 135 as shown in FIGS. 1-3 and 5, single, continuous posts 240 are arranged and no mesh layer is arranged. As the multi-level wick structures of FIG. 6 may be simplified due to lack of a mesh layer and the continuous posts 240, simple and cost-efficient configurations and arrangement may be achieved.

As described herein, the multi-level wick structures for a vapor chamber heat spreader according to the present disclosure may include multiple liquid flow paths. The multiple liquid flow paths include a vertical liquid flow path and a lateral liquid flow path. The vertical liquid flow path facilitates a shorter liquid flow in a hot spot area. The vertical liquid flow path involves a downward movement of liquid from the condenser to the evaporator by capillary action. The lateral movement involves movement of liquid in the direction perpendicular to the downward movement. As the multi-level wick structures quickly replenish condensed liquid using a shorter liquid flow path, dry out problems may be alleviated and potential thermal runaway problems may be avoided. As described in the embodiments above, the method of supplying liquid in the vapor chamber using the multiple liquid flow paths is provided. The method includes supplying liquid from the condenser to the evaporator via the condenser posts and via the evaporator posts in the vertical direction and supplying liquid from the condenser to the evaporator in the lateral direction. The liquid supply in the vertical direction facilitates shorter and faster supply of liquid in the hot spot area and may resolve or minimize the dry out problems and the thermal run away damage.

It is intended that all matter contained in the above description or shown in the accompanying drawings shall be interpreted as illustrative only and not limiting. Changes in detail or structure may be made without departing from the spirit of the invention as defined in the appended claims.

The invention claimed is:

1. A vapor chamber heat spreader, comprising
a condenser arranged at a first end of the vapor chamber heat spreader;
an evaporator arranged at a second end of the vapor chamber heat spreader, wherein the second end is opposite to the first end; and
multi-level wick structures arranged in a hot spot area, the multi-level wick structures comprising:
a first planar wick arranged adjacent to the condenser;
a second planar wick arranged adjacent to the evaporator;
a plurality of porous condenser posts for supplying liquid condensed by the condenser and having a cylindrical shape;
a plurality of porous evaporator posts for supplying the condensed liquid towards the evaporator and having a cylindrical shape; and
a mesh layer arranged between the condenser posts and the evaporator posts and configured to separate the condenser posts from the evaporator posts, the mesh layer including a plurality of vent holes present therein;
wherein the condenser posts extend from the first planar wick to the mesh layer and the evaporator posts extend from the mesh layer to the evaporator;
wherein vapor from the evaporator is operable to rise towards the condenser via the vent holes, and the condenser posts, the mesh layer and the evaporator posts form a liquid supply channel for supplying the condensed liquid; and
wherein the vent holes, the condenser posts and the evaporator posts do not overlap such that:
the evaporating posts are spaced apart from each other;
the vent holes are arranged between two neighboring evaporator posts; and
each condenser post is arranged between the two neighboring evaporator posts and between two neighboring vent holes present in the mesh layer.

2. The vapor chamber heat spreader of claim 1, wherein the vapor rises through a first space between the evaporator posts and a second space between the condenser posts.

3. The vapor chamber heat spreader of claim 2, wherein the multi-level wick structures further comprise a vapor supply channel including the first space, the second space and the vent holes.

4. The vapor chamber heat spreader of claim 1, wherein the mesh layer includes a sintered porous layer.

5. The vapor chamber heat spreader of claim 1, further comprising a lateral liquid supply channel for supplying the liquid laterally from the side of the vapor chamber to the evaporator, the lateral liquid supply channel arranged outside of the hot spot area.

6. The vapor chamber heat spreader of claim 1, wherein porous condenser posts of the plurality of porous condenser posts are spaced apart from vent holes of the plurality of vent holes in a horizontal direction.

7. The vapor chamber heat spreader of claim 1, wherein the first planar wick has a first porosity and the second planar wick has a second porosity that is different from the first porosity.

8. A multi-level wick structure for a vapor chamber heat spreader having a condenser and an evaporator, comprising:
a first porous layer arranged on a condenser side;
a second porous layer arranged on an evaporator side;

a first set of porous posts arranged adjacent to the first porous layer and having a cylindrical shape; and a second set of porous posts arranged adjacent to the second porous layer and having a cylindrical shape;

a mesh layer having predetermined permeability and separating the first set of porous posts from the second set of porous posts and configured as a manifold to distribute the condensed liquid to the second set of porous posts, where the mesh layer further comprises a plurality of vent holes that permit vapor to rise towards the condenser side;

wherein the first set of porous posts and the second set of porous posts are configured to supply liquid condensed by the condenser from the condenser side to the evaporator side; and wherein the vent holes and the first set of porous posts and the second set of porous posts do not overlap such that:
the second set of porous posts are spaced apart from each other;
the vent holes are arranged between two neighboring second set of porous posts; and
each of the first set of porous posts is arranged between the two neighboring second set of porous posts and between two neighboring vent holes present in the mesh layer.

9. The multi-level wick structures of claim 8, wherein the first set of porous posts and the second set of porous posts are arranged in an alternating pattern and not aligned in a vertical direction extending from the condenser to the evaporator.

10. The multi-level wick structures of claim 8, wherein the first set of porous posts and the second set of porous posts are aligned in a vertical direction extending from the condenser to the evaporator.

11. The multi-level wick structures of claim 8, wherein the first set of porous posts and the second set of porous posts integrally form continuous posts extending from the condenser side to the evaporator side.

12. The multi-level wick structures of claim 8, wherein porous posts of the first set of porous posts are spaced apart from vent holes of the plurality of vent holes in a horizontal direction.

13. The multi-level wick structures of claim 8, wherein the first porous layer has a first porosity and the second porous layer has a second porosity that is different from the first porosity.

14. A vapor chamber heat spreader, comprising:
a condenser arranged at a first end of the vapor chamber heat spreader;
an evaporator arranged at a second end of the vapor chamber heat spreader, wherein the second end is opposite to the first end; and
multi-level wick structures comprising a first liquid flow channel including a plurality of porous condenser posts, a second liquid flow channel including a plurality of porous evaporator posts, and a vapor flow channel including a plurality of vent holes;
wherein the condenser posts and the evaporator posts are cylindrically-shaped;
wherein the first liquid flow channel includes a lateral movement of liquid condensed by the condenser from the condenser to the evaporator, and the second liquid flow channel includes a downward movement of the liquid from the condenser to the evaporator in a hot spot area, where the second liquid flow channel provides a shorter liquid flow path than a liquid flow path provided by the first liquid flow path;
wherein the vapor flow channel includes an upward movement of vapor from the evaporator to the condenser and the vapor flow path does not overlap with the second liquid flow path in the hot spot area;
wherein the vent holes and the condenser posts and the evaporator posts do not overlap such that:
the evaporating posts are spaced apart from each other;
the vent holes are arranged between two neighboring evaporator posts; and
each condenser post is arranged between the two neighboring evaporator posts and between two neighboring vent holes present in the mesh layer.

15. The vapor chamber heat spreader of claim 14, wherein the hot spot area is arranged in a location where a heat source is present.

16. The vapor chamber heat spreader of claim 14, wherein the hot spot area is arranged at a plurality of locations throughout the entire length of the vapor chamber heat spreader, each of hot spot having a heat source present therein.

17. The vapor chamber heat spreader of claim 14, wherein porous condenser posts of the plurality of porous condenser posts are spaced apart from vent holes of the plurality of vent holes in a horizontal direction.

* * * * *